United States Patent [19]

Lenz

[11] Patent Number: 5,446,389
[45] Date of Patent: Aug. 29, 1995

[54] PORTABLE TEST SET FOR TESTING OPERABILITY OF A LOCOMOTIVE

[75] Inventor: Edward M. Lenz, Erie, Pa.

[73] Assignee: General Electric Company, Erie, Pa.

[21] Appl. No.: 999,635

[22] Filed: Dec. 31, 1992

[51] Int. Cl.$^6$ .................. G01R 31/00; G01M 15/00
[52] U.S. Cl. .................. 324/555; 324/73.1; 324/772; 73/116; 246/169 R
[58] Field of Search .............. 324/503, 512, 527, 540, 324/555, 556, 73.1, 158 R, 158 MG, 772; 73/116; 246/169 R

[56] References Cited

U.S. PATENT DOCUMENTS

| | | | |
|---|---|---|---|
| 4,565,963 | 1/1986 | Shaw | 324/503 X |
| 4,718,271 | 1/1988 | Garland | 73/116 |
| 4,804,910 | 2/1989 | Russell | 324/158 MG X |
| 4,884,033 | 11/1989 | McConchie, Sr. | 324/503 |
| 5,039,940 | 8/1991 | Johnson et al. | 324/73.1 X |
| 5,077,671 | 12/1991 | Leslie et al. | 324/73.1 X |

*Primary Examiner*—Kenneth A. Wieder
*Assistant Examiner*—Diep Do

*Attorney, Agent, or Firm*—Jill M. Breedlove; Marvin Snyder

[57] ABSTRACT

A portable test kit for testing electrical and mechanical operation of a locomotive includes one multi-pin connector for connecting to an MU connector on a locomotive. The multi-pin connector is wired in the test kit to a plurality of indicator lights and a plurality of multi-position switches. The lights provide a visual indication of signal presence at the MU connector. The switches enable commands to be placed on the train line through the MU connector to determine if the locomotive is responsive to train line signals. A governor connector and associated indicator lights monitor signals from the locomotive governor system. A plurality of galvanometers are mounted in the kit with corresponding connection jacks for connection to selected points in the locomotive system for simultaneous monitoring of circuit performance. At least a pair of rheostats are connected to the MU connector for controlling loading on selected train line conductors. The kit also includes apparatus for measuring air pressure, temperature, filter condition, fuel system operation, engine operation, braking capability and alternator output.

6 Claims, 6 Drawing Sheets

PORTABLE TEST SET FOR TESTING OPERABILITY OF A LOCOMOTIVE

BACKGROUND OF THE INVENTION

This invention relates to locomotives and, more particularly, to a portable apparatus for testing operability of a locomotive from an external location.

Present day locomotives are complex machines having myriad electronic circuits and on-board computer systems. In a typical diesel-electric locomotive, a diesel engine runs at constant speed to drive an alternator supplying electric power to propulsion motors and to drive another alternator supplying alternating current (AC) electric power at a constant frequency for various appliances on the locomotive or in cars pulled by the locomotive. Each of these power systems require separate control systems for regulating locomotive speed or horsepower and for allocating a division of power between the power systems in accordance with the power available from the engine.

In addition to the complexity inherent in the control systems, locomotives are also designed to operate in multiple unit consists, thus increasing complexity. For example, when operating in a consist, operator commands in a lead locomotive must be transmitted to equivalent commands in a trailing locomotive. Accordingly, each locomotive circuit is not only responsive to on-board command functions but also to command functions from another interconnected locomotive.

Command functions are transmitted between locomotives via a hardwired cable typically referred to as a train line, each end of which terminates in a multiple unit (MU) connector and a governor connector. The MU connector passes the majority of functions between locomotives, such as an engine start command and motor excitation commands. The governor connector transmits only the functions associated with engine horsepower or locomotive speed. A particular excitation command issued on the MU connector may be acknowledged by a speed setting passed on the governor connector.

Historically, locomotive operability has been tested by individually checking each conductor in the train line and in the power and control compartments and by operating the locomotive and confirming that the locomotive responds to operator commands. A typical train line check would require a technician at each end of the locomotive, one of whom would apply a voltage to a particular conductor in the train line while the other confirmed that such voltage appeared at the opposite end of the train line, i.e., at the other MU connector.

SUMMARY OF THE INVENTION

It is an object of the present invention to provide a simplified method and apparatus for locomotive testing.

It is another object of the invention to provide a portable testing apparatus which can be applied to any type of locomotive.

The above and other objects, features and advantages are achieved in one form by a portable test set having a pair of connectors for connection to an MU and a governor connector at one end of a locomotive. The test set includes a plurality of indicator lights with each of the lights being coupled to a respective one of the conductors in each of the MU and governor connectors. The presence of a signal on any conductor will cause the corresponding light to be actuated. The lights are selected to actuate only if the signal has a predetermined minimum magnitude, e.g., 65 volts in a 74 volt system, thereby assuring that signals are passed with minimum degradation.

The test set also includes a plurality of switches operatively coupled to some of the train line conductors and adapted to selectively apply signals to the conductors for energizing some functions on the locomotive. In at least some modes, the switches can be set to operate the locomotive, i.e., to cause the diesel engine to start and to apply different values of excitation to the motors for propelling the locomotive. Other functions, such as braking, sanding and bell can be actuated from the test set.

The test set further includes a plurality of galvanometers and a corresponding plurality of connection means for coupling signals to the galvanometers. The galvanometers may measure voltage or current and allow simultaneous monitoring of multiple signals in the locomotive system.

Still further, the test set includes at least two rheostats coupled to selected conductors in the train line connector for providing a variable impedance on the lines. The rheostats may be coupled in the headlight line for varying headlight intensity or other variable functions such as setting dynamic braking excitation.

The test set also includes a digital timer which can be connected in circuit with the locomotive control systems for determining the accuracy of selective timing functions. For example, the timer may be connected in circuit with a time delay device for determining the actual delay time of the device. To this end, connection means are available adjacent the face of the timer for connecting leads from the timer to the circuit device under test. The timer is resettable from the test set and can be manually actuated and automatically stopped.

BRIEF DESCRIPTION OF THE DRAWINGS

For a better understanding of the present invention, reference may be had to the following detailed description taken in conjunction with the accompanying drawings in which.

DETAILED DESCRIPTION OF THE INVENTION

Figure 1:
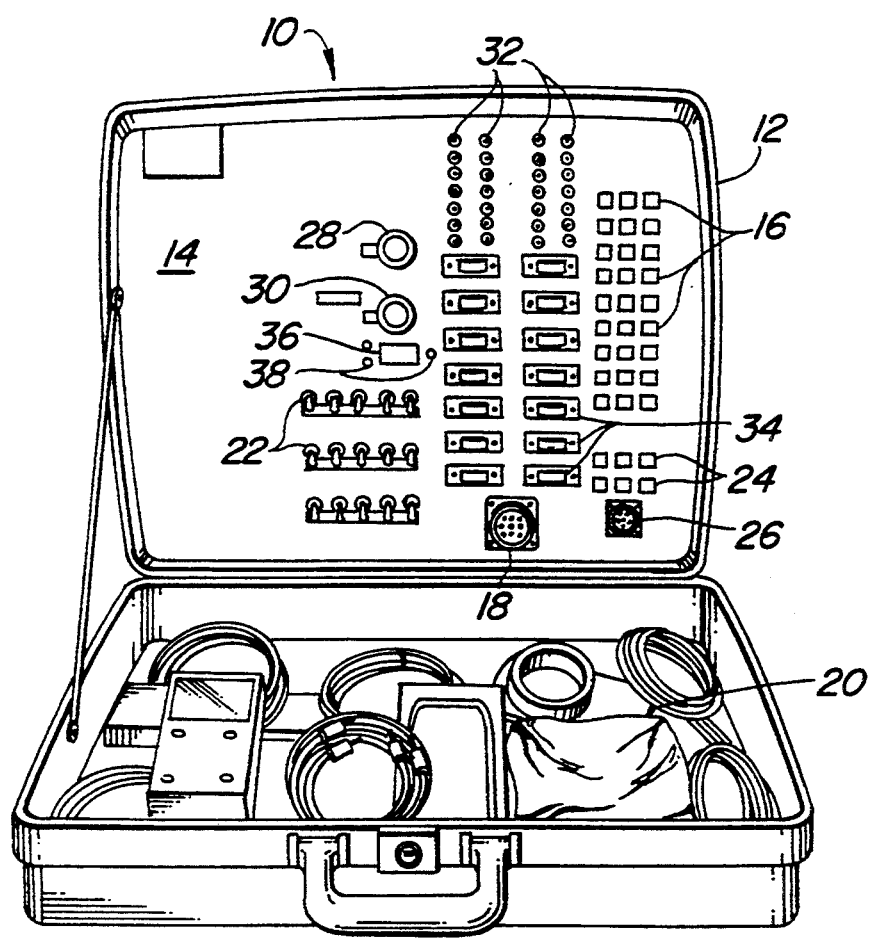
FIG. 1 is a view of a test set constructed in accordance with the teachings of the present invention.

Turning first to FIG. 1, there is shown one form of a test set 10 in accordance with the present invention. The test set is preferably constructed within a conventional hard-cover attache-type case 12 having a central hinged divider 14 forming a base or support for a plurality of electrical connection means, switches, indicator lights and meters. More specifically, a plurality of indicator lights 16 are mounted on base 14 in a pattern of three columns by nine rows. Each of the lights 16 is connected via a wiring harness on the reverse side of the base 14 to a corresponding one of the 27 pins in a conventional connector 18. The connector 18 is selected to have at least the number of pins (27 in this case) commonly available in a multiple-unit (MU) connector normally found on a locomotive with which the test set is to be used, i.e., the number of pins (and the number of indicator lights 16) may be different in different models of test sets. An adaptor cable indicated generally at 20 is stored in the lower portion of case 12 and is used to couple the test set connector 18 to a conventional MU connector on a locomotive.

A plurality of switches 22 are also mounted to base 14. The switches 22 may be a combination of double pole, double throw (DPDT) or double pole, single throw (DPST) switches. The switches 22 are coupled in circuit with selected pins of the connector 18 so that switching of the switches 22 is effective to connect selected signals, e.g., ground or a DC voltage, onto the selected pins. For a better understanding of the use of switches 22 and indicator lights 16, reference is made to Table I which sets forth an exemplary listing of MU connector pin assignments for an exemplary locomotive. As shown, pin number 2 is connected to a line which activates the locomotive signal and bell. Actuating the one of the switches 22 coupled to this pin will not only cause one of the lights 16 to light but will also cause the locomotive bell to be actuated. Similarly, the locomotive governor itself can be caused to operate by applying excitation to pins numbered 3, 7, 12 and 13.

Referring again to FIG. 1, located directly below the indicator lights 16 is another group of indicator lights 24 and another connector 26. The connector 26 includes a plurality of pins, typically 16, which allows the connector to be coupled to a conventional governor connector on a locomotive. As is well known, each locomotive adapted for operation in a consist generally includes a governor connector for coupling to other locomotives in the consist. The governor connector is coupled to certain relays in the locomotive which are actuated by different horsepower commands. For example, if a particular horsepower is commanded from a lead locomotive in a consist, the governor connector and associated wiring harness provide signals showing that the correct relays have been actuated. When the test set 10 is coupled to the MU and governor connectors on a locomotive, the switches 22 can be used to input horsepower commands to the locomotive through the MU connector and the results of those commands can be observed from the lights 24 which are coupled to selected pins in connector 26.

The test set 10 also includes a pair of potentiometers or rheostats 28,30 which are coupled in circuit with selected ones of the pins in connector 18. In particular, rheostat 28 is coupled to pin 25 and rheostat 30 is coupled to pin 24. Adjusting rheostat 28 will vary the intensity of the light from the locomotive headlight while adjusting rheostat 30 will vary the dynamic braking excitation. The operation of rheostat 28 and the associated locomotive circuits can be determined by visual observation of the headlight. Rheostat 30 limits dynamic braking excitation for the traction motors.

A number of other locomotive functions can also be monitored by test set 10 using the pairs of connection means 32, which may be banana jacks, which are coupled to corresponding ones of a plurality of galvanometers 34. In the particular embodiment illustrated, there is a one-to-one relationship between pairs of jacks 32 and galvanometers 34. Accordingly, a plurality of voltages or currents may be monitored simultaneously. However, the galvanometers 34 are utilized by coupling signals directly to jacks 32 from selected points in the control circuits for the locomotive.

Locomotives also typically include a plurality of timers or time delays which time out after set intervals. For proper operation of the locomotive, the time delays must be relatively accurate. Test set 10 includes a resettable digital timer 36 which can be utilized to verify the operation of such time delays. A pair of connection means 38 are operatively associated with timer 36 so that the timer may be coupled in circuit with a selected time delay device. Timer 36 can be started concurrently with application of power to the time delay device and will automatically stop upon time-out of the device. The reading on the timer 36 will represent the time delay and verify proper operation.

Figure 2A:
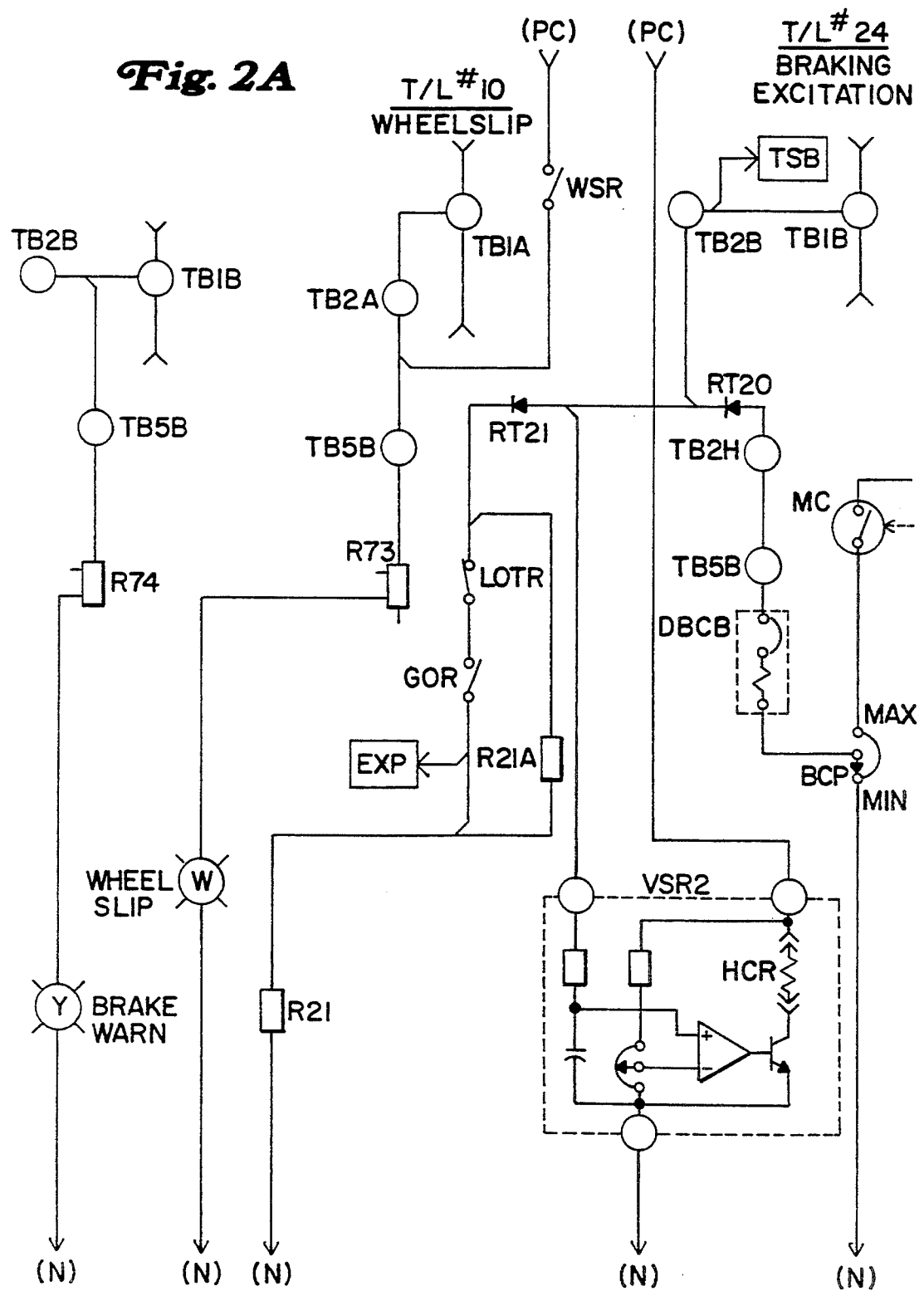
FIGS. 2A and 2B comprise a schematic diagram of a portion of a locomotive control circuit illustrating one method of monitoring circuit operation.
Figure 2B:
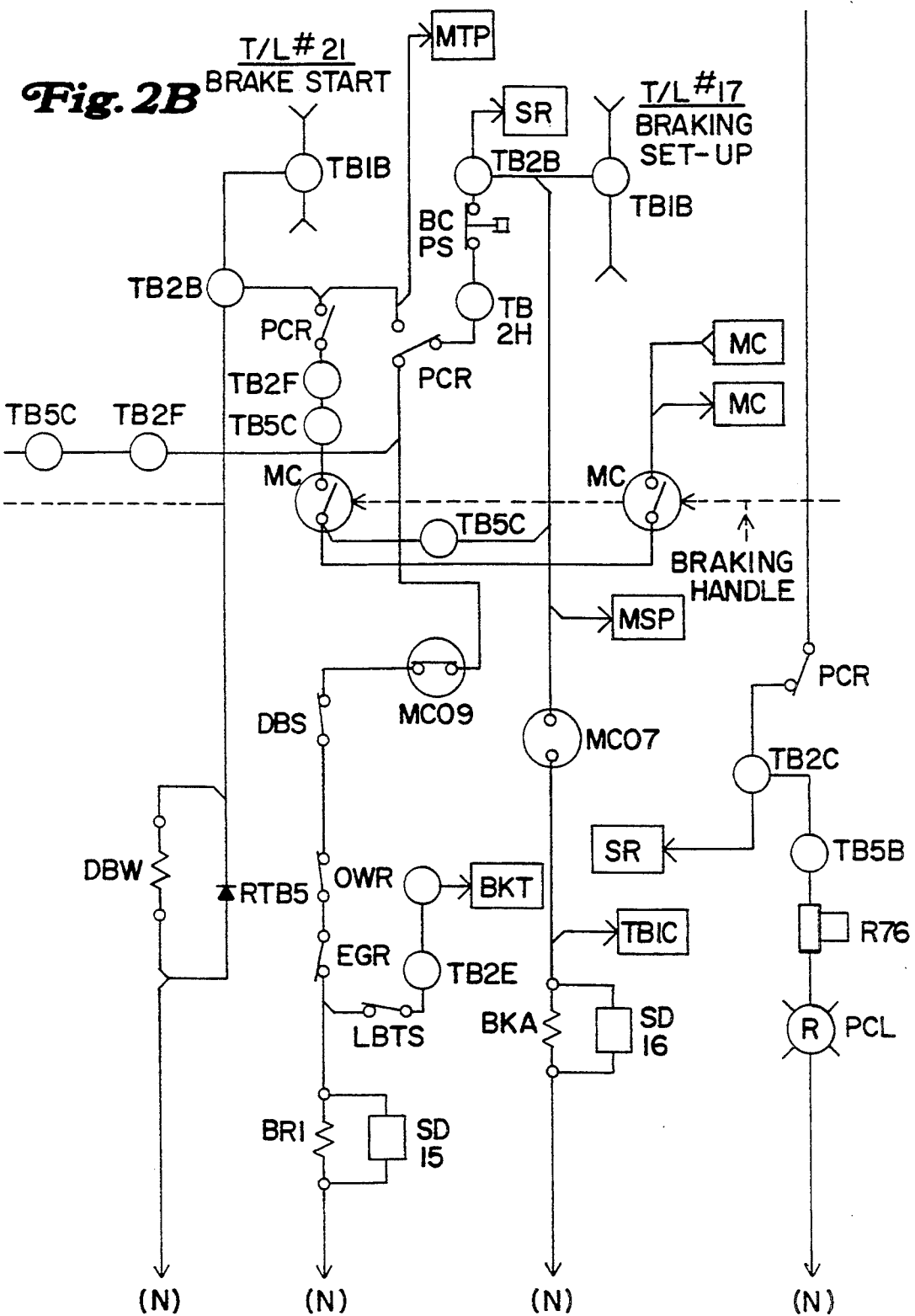

For a better understanding of the invention, reference is made to FIGS. 2A and 2B and 3A and 3B which are exemplary schematic representations of a portion of an electronic control system for a diesel-electric locomotive of a type with which the inventive test set may be used. FIGS. 2A and 2B shows a portion of a dynamic braking excitation and control circuit. The function and method of operation of this circuit is not of interest except to the extent of describing the interface with the test set 10. At the left of FIG. 2, a brake warning light BWL is connected in the circuit. At the upper left of the figure, the light BWL is connected in the circuit. At the upper left of the figure, the light BWL is connected to terminals MU20F and MU20R. The acronym MU refers to the multiple unit connector to which the test set 10 may be coupled. The number 20 refers to the particular pin 20 in the connector while the F and R characters refer to front and rear connectors. It can be seen that the BWL light can be energized from the MU 20 pin or the status of the light can be monitored from the pin. Other functions are similarly monitorable. The wheel slip light WSL is monitored or energized from MU 10; braking excitation is available at MU 24; brake start is available at MU 21 and dynamic brake set-up is available at MU 17. Note that each of the pins are identified in Table I.

Figure 3A:
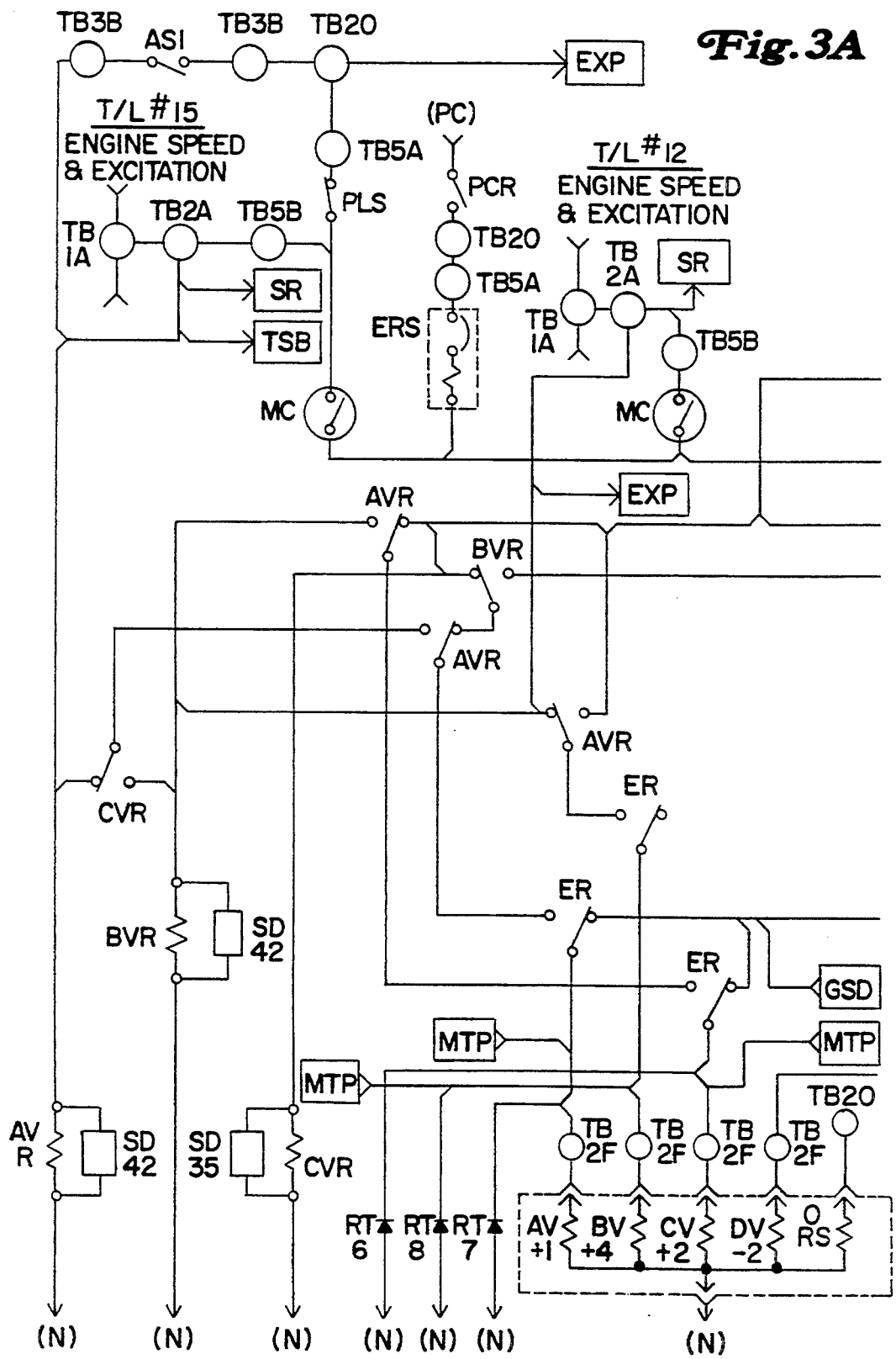
FIGS. 3A and 3B comprise a schematic diagram of another portion of a locomotive control circuit illustrating another monitoring method.
Figure 3B:
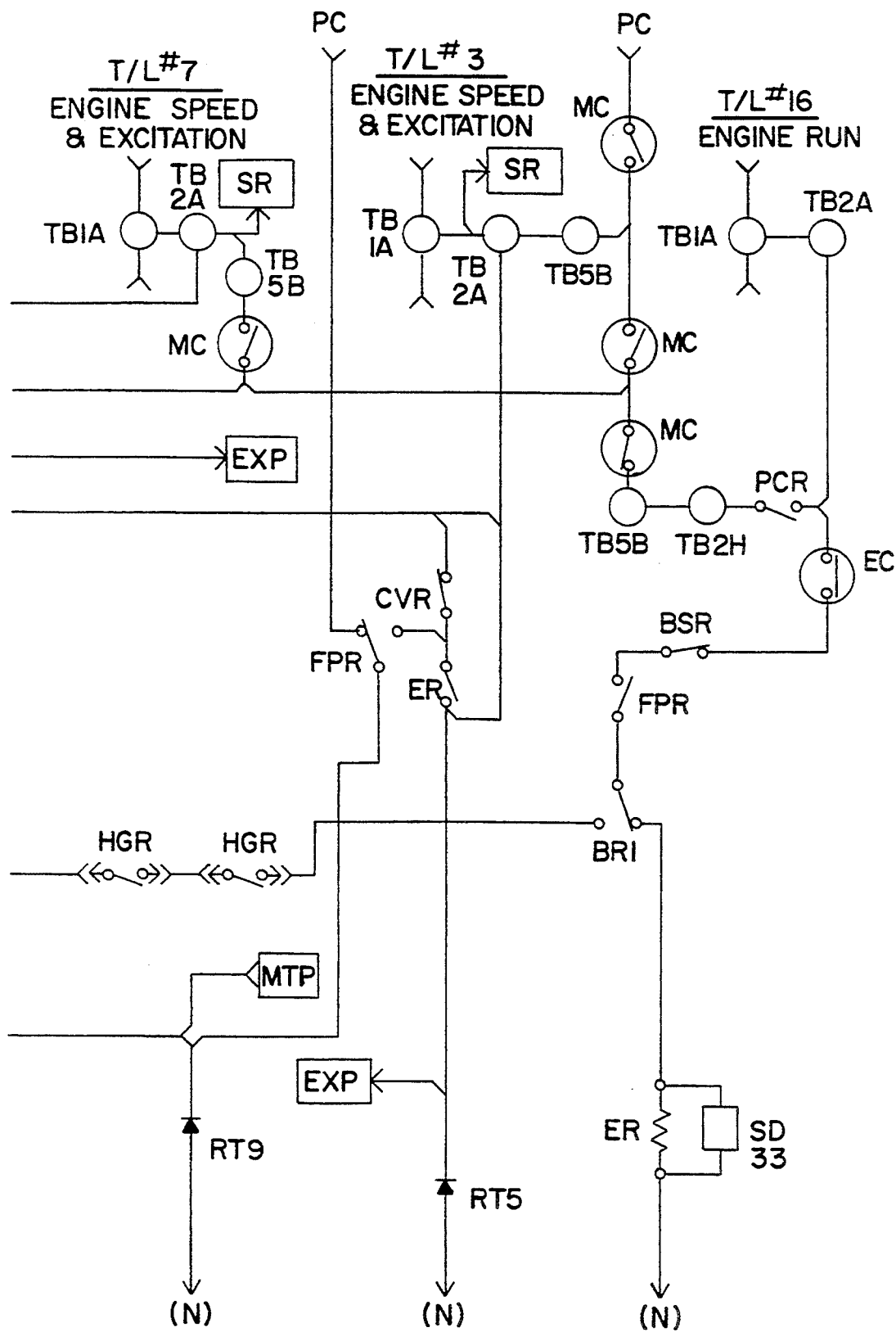

FIGS. 3A and 3B comprise a partial schematic representation of engine speed and excitation controls. At the lower left there are three engine speed relays identified as AVR, BVR and CVR. Each relay sets a different horsepower output for the locomotive motors. Along the top of the figure, it can be seen that each relay is connected to a corresponding MU connector pin. For example, relay AVR is coupled to MU pin 15, relay BVR is coupled to pin 7 and relay CVR is coupled to pin 12. Signals from these relays are coupled to governor solenoid block GOV. Each solenoid in the GOV block modifies the engine speed command by a binary increment. Each solenoid is coupled to the governor connector 26. Consequently, actuation of relays AVR, BVR and CVR can be monitored by the status of lights 24 in the test set 10.

While the test set 10 as thus far described provides a method and apparatus for testing various locomotive functions using only the set, other functions may be tested by applying input signals or manual commands to the locomotive. One such test is an MU sequence test which confirms that signals are passed through the train line conductors from one end to another end of the locomotive. In this test, and referring to Table I, a jumper may be sequentially connected between pin 13, control positive voltage (typically battery voltage of 74 volts) and each of the other pins (except pin 4). As each pin is energized by the jumper, a corresponding one of the lights 16 will light. If the voltage reaching the lights 16 in the test set is less than 65 volts, indicating an undesired impedance in the signal path, the light will not illuminate. Thus, the test set 10 provides a means for verifying train line integrity.

The test set 10 is also utilized to confirm proper operation of locomotive functions. For example, an operator can select a throttle position and the test set 10 will verify that the throttle position selected is properly transmitted over the train line by observing which of the lights 16 are illuminated.

Test set 10 also provides a method of confirming operation of circuits within the locomotive control system by connecting the galvanometers 34 directly to selected test points in the system. The control system can then be exercised by selective actuation of various relays and switches and the results observed on the galvanometers.

Figure 4:
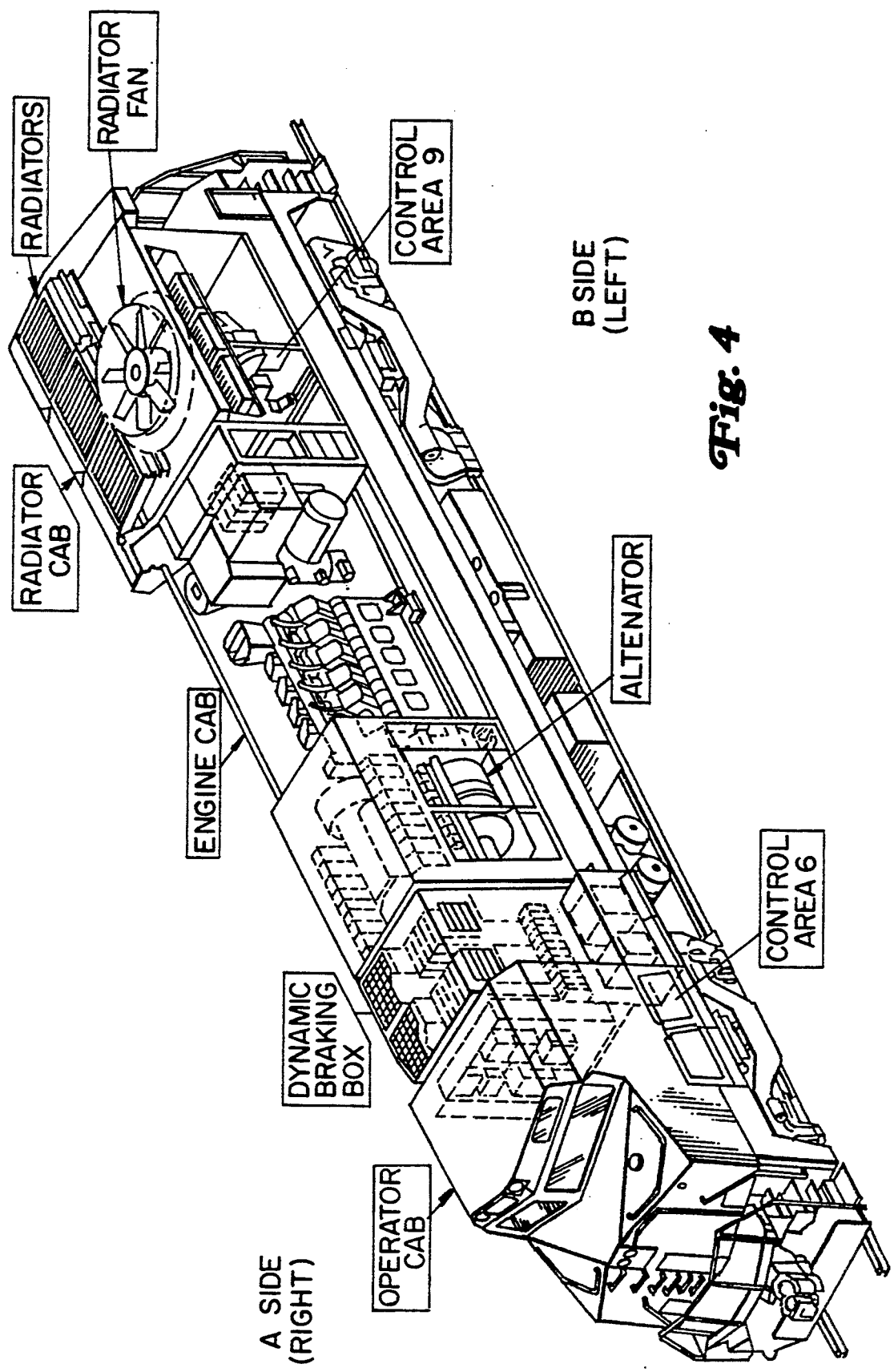
FIG. 4 is a cutaway drawing of a locomotive.

The test set 10 also includes a plurality of other testing devices such as a manometer, liquid pressure gauges, air pressure gauges, bleeder valves for connection to the locomotive air system, temperature sensors, voltage and current meters and a resistance meter. Various of these devices are visible in the lower portion of the test set shown in FIG. 1. These test devices are commercially available devices and are used to verify operation of the locomotive air system, engine filter conditions and other common tests. In order to appreciate how these test devides coordinate with the test set 10, the following text sets forth an exemplary test procedure for one type of locomotive. Tables II–IV should be referenced in conjunction with this procedure for an understanding of the acronyms and FIG. 4 is referenced for an understanding of the location of various elements being tested.

TEST INSTRUCTIONS

1. Serial Numbers and Checks
   A. Record the Serial Number, Make and Model Number of the following devices:

| | |
|---|---|
| Locomotive | Engine |
| Turbocharger | Traction Alternator |
| Exciter Generator | Auxiliary Generator |
| Traction Motor Blower | Air Compressor |
| Lube Oil Cooler | Radiator Fan Drive |
| Rectifier Panels (6) | Traction Motors (6) |
| Cab-Heaters | Main Air Reservoirs (2) |
| Batteries | Alternator Power Take Off |
| Control Device Compartment | Power Device Compartment |

B. At this time record and correct all defects and missing parts.
   C. Also make a visual inspection of the:
      1. Water
      2. Oil
      3. Fuel
      4. Air
      5. Pipes
      6. Connections
      7. Gasketing
      8. Check for purged grease in the couplings and bearings
      9. Check inspection stamps for cleaned and installed filters
      10. Also check the automatic drain valve using freon. Instructions are in the back under "Extras."
      11. The locomotive must be cleaned of debris and loose hardware.
      12. Carefully look at all of the commutator brushes—that the brushes are seated, and there is no debris on the commutator.
      13. That the blanking plates are in position.
2. Settings
   NOTE: RECORD ALL SETTINGS
   A. Remove the braking grid blower motor brushes.
   B. Move BKT to braking
   C. Record the values
      BKT 2A to BKT 11C should be 1.267 ohms—1.549 ohms
      BKT 6A to BKT 7C should be 1.267 ohms—1.549 ohms
      BKT 4A to BKT 9C should be 1.357 ohms—1.659 ohms
   D. Restore the locomotive.
   E. Center the reverser.
   F. Measure the resistance from
      1f–1ff
      2f–2ff
      3f–3ff
      4f–4ff
      5f–5ff
      6f–6ff
   NOTE: Resistance is proportional to the length of the cable.
   G. Remove "AM" wire at LS-1.
   H. Using the millivolt power supply, set it at 81 millivolts. Adjust AR resistor so that it will read 810 amps on the load meter, i.e. 810 amps braking. The motoring positions should fall into place. Vary the millivolt power supply and watch the load amp meter needle to be sure that it doesn't stick or hang up in any position.
   I. Remove the FS wire at EFR. Measure 7.2±5% ohms between EFR C and D. Adjust if necessary. Replace the FS wire.
   J. Measure 85±5% ohms between EFR M (ECK) and N (EEF2). Adjust if necessary.
   K. Insulate FDH to EDF at GFA 4. Measure 345±10% ohms at R28. Adjust if necessary. Remove GFA insulation.
   L. Remove the PA card from MSP and verify that the jumpers are correct for a 6 axle locomotive. Pin 28 jumpered to pin 30, 26 to 36, and 32 to 34, and open between pins 30–36 and 34–36. Replace the PA card.
   NOTE: Before servicing, install test gages in the system as follows:
   Install two test lube quick disconnect fittings (one at pump outlet and one at header).
   Check to make sure the water tank temperature gauge is installed and a water pressure gage at the governor.
   There must be a quick disconnect fitting for fuel pressure.
3. FUEL 01L
   Fill tank to 500 gal. approximately. After load test completely fill tank approximately 3900 gal. (This tests the siphon pipe for leaks.) When filling the tank check for leaks. Watch fuel gages and sight glasses for proper function. (Record)
4. LUBE OIL
   The locomotive must be filled first time through the header (approximately gallon). Engine crankcase and pump sump drain valves closed, lube cooler drain valve open. Open crankcase doors R+L8. Verify oil is flowing over camshaft and crankshaft. Record type of lubricant.

5. WATER

Approximately 380 gallon. Fill the water tank with common tap water.

NOTE: The engine may be shipped with the water pump drain plug not installed. Check this first before filling and install if needed. Add 4–5 gallons of Nalco 39RR "red" water treatment once the system leaks have been corrected. NOTE: Additional leaks may occur once water goes to the radiators and the engine outlet pipe but these can be corrected by shutting down the engine and allowing the water to drain back into the water tank. Record type of treatment.

6. FAN GEAR BOX

Approximately 13 quarts—record oil used.

7. COMPRESSOR CRANKCASE

Approximately 16 gallons—record oil used.

8. ALT. GEAR TRAIN

Approximately 3 quarts—record oil used.

9. GOVERNOR

Approximately 2 quarts—record oil used.

10. TOILET TANK

City water—verify drain line is closed—check fill from both "A" and "B" sides (record).

11. WIRE CHECK

Wire check all terminal boards, electrical panels, relays, contactors, braking switch, reverser switch, controller, circuit breakers, switches, and resistors to the wire list.

NOTE: This is done at random unless many mistakes are found, only then check 100%.

12. MEGGER

NOTE: The dielectric tests are in accordance with 41A302705. These are general instructions and must be dealt with common sense and safety.

Use of hipot wire is to protect expensive components and tie together individual circuits. Record megohm reading. Must be above 3 megohm; if not, check with GE representative before hipotting.

13. HIPOT

When hipotting you are testing the wire and wire harness, not necessarily the components. When restoring be careful to remove all hipot wire. Record hipot voltage and time.

14. BATTERY TEST

A. At the annunciator panel, disconnect and isolate the IBX (+) and IBY (−) wires.

B. Turn off all circuit breaks and switches.

C. With the battery switch open, connect the batteries, and check the voltage at the battery switch upper contacts. Should read about 64 VCD with the left terminal (+) and the right terminal (−). If the batteries are not fully charged, a charger can be connected to them during the following tests. Voltage should not exceed 75 if the charger is used. A separate 74 volt supply can be connected in place of the batteries if desired.

D. Test voltages listed in this instruction assume the control voltage is 74, same as on an operating locomotive. Listed voltages will be proportionally less if the control voltage is less than 74. Check the polarity of the IBX (+) and IBY (−) wires at AP. If correct, reconnect the IBX wire to AP. Use caution because the wire is hot and there is no current limiting device or fuses in the circuit.

15. LIGHTING

With all breakers off, close LCB.

The light circuits must be turned on and checked, one at a time.

Each lighting switch light must be checked per locomotive schematic.

16. RECEPTACLES

Each receptacle must be checked for voltage+−polarity.

Use the polarity checker in test kit.

17. HEADLIGHTS

With all breakers off close FHB, check brightness of each position of front headlights, open FHB, close RHB and repeat instruction. MUHL SW must be in middle unit.

18. WARNING LIGHT

All breaker open, close WLB front or rear headlight. SW must be closed to check warning light.

19. CONTROL AIR

Connect shop air (100 PSI), set control air for 60 PSI, activate the pneumatic contactors, one at a time (some may be stiff and will have to be checked later). Reset control air for 80 PSI or working pressure.

Set the pressure switches for the following pickup and drop out levels:

| Switch | Pickup | Drop Out |
|--------|--------|----------|
| BCPS | 22/24 PSI | 5/7 PSI |
| CGS1 | 140/141 PSI | 127/133 PSI |
| CGS2 | 145/146 PSI | 132/138 PSI |
| IBS | 13/15 PSI | 5/7 PSI |
| PCS | 58/62 PSI | 38/42 PSI |
| SPS | 23 PSI | 11 PSI |

NOTE: Approximate setting for SPS. Set for emergency sand time during the air brake test. (Record all settings.)

20. FUEL PUMP

Insulate GS+ and GS− a. Close fuel pump breaker
b. EC, SW in start
c. Jumper TB6B-S to B6B-T
d. Push reset button
e. Observe direction of rotation of fuel pump
f. If needed prime fuel pump
g. Set 40# on fuel regulator (45 PSI)
h. Check for leaks
i. Check shutdown with: FCOLS, FCORS, ESP1, ESP2, COP
j. Leave fuel pump run for 15 min. or more.

Short break—then open FPB (record).

Check—GS+ or GS− will not pick up when EC is in isolate, EC is in run, or if the barring over cover is removed.

21. MASTER CONTROLLER INTERLOCKING

Turn off all breakers, TH to idle and BH to off.

Center and remove the reverse handle (RH).

Check that BH cannot be moved from off and that TH cannot be moved from idle.

Insert RH and leave centered. Check that TH can be moved to any motoring position or to MU stop. BH cannot be moved from off, and RH cannot be removed if TH is in any motoring position.

Move RH to forward. TH and BH can be moved but only if the other is in idle or off. RH cannot be moved if TH or BH are in other than idle or off. Repeat with RH in reverse.

Move BH to max. braking and check that TH can be moved to MU stop.

22. MU SEQUENCE

1. Connect the kit to the locomotive short hood MU receptacle multiple unit receptacle and the governor plug.
2. Using the probe, ring Out the rear multiple unit receptacle.
   NOTE: Beware of the #4 pin. Use the safety cap, also wear safety glasses. The #4 pin is 75 volts battery negative.
3. Ring out all of the MU pins to the kit. The 8 and 9 pins will be reversed to the rear MU.
4. Push the attendant call button. You will get a #2 pin light and the signal bell should ring.
5. When you excite the #3 pin, the DVR relay will pick up.
6. When you excite the #5 pin, sand will blow from the front and rear sand valves.
7. Excite pin #6 after one minute, 60 seconds, the AFR should pick up. Also, you'll have a 6 light.
8. When you excite pin #7, the CVR relay will pick up.
9. When you excite the #8 pin, the reverser will throw to forward.
10. If you excite the #9 pin, the reverser will throw to reverse.
11. When you excite the #10 pin, the wheelslip light will not light, but if you pick up the wheelslip relay, the #10 light will light.
12. The 11 light is tied through the trainline to the 23 and these two will blow directional sand, depends on the position of the locomotive reverser.
13. When you excite the #12 pin, the BVR will pick up.
    NOTE: The 13 pin is battery positive.
14. Excite the 15 pin, the AVR rely will pick up.
15. Before you excite the 16 pin, you put a jumper on 4A to 4C on the fuel pump relay. When you excite the pin, ER will pick up.
16. Excite pin 17 KBA will pick up.
17. Excite pin 21 as you close DBB, the BR1 will pick up.
18. Excite pin 22, the CR will pick up.
19. Excite pin 23, this is tied to pin 11. Again, directional sand will blow.
20. Excite pin 24 as you vary the volts HBR will pick up in the area of 56.5±5 volts.
21. Excite pin 25, adjust MU headlight switch for proper operation.

23. SEQUENCE

1. Check each of the breakers on the EC panel with the kit breaker checker.
2. Close the battery switch. This will energize the devices on sheet 20.
3. Close the control breaker (COB). You will get a 13 light and GOR will pick up. You will also energize the devices on sheet 20.
4. Close Local Control Breaker (LCCB). This will energize devices on sheet 20.
5. Close Engine Control Breaker (ECB). EF will pick up and will energize devices on sheet 20.
6. Close Fuel Pump Breaker (FPB). This will energize devices on sheet 10.
7. Push the Fuel Pump Reset button on the EC panel. This will pick up EAFR, ROR, and FPR.
8. Push the Engine Stop button on the EC panel. EAFR, ROR and FPR will drop out.
9. Push the Fuel Pump Reset button on the Engine Control Panel (FPRB2). This will again pick up EAFR, ROR, and FPR.
10. Now push the Engine Stop button on the start stand. EAFR, ROR and FPR will drop out.
11. Reset the fuel pump.
12. Push ESP3 which is in the Control Device compartment. Again, everything should drop out.
13. Reset the fuel pump.
14. Trip the COP.
15. Reset the fuel pump. Everything should pick up again.
16. Push the fuel cutout switch underneath the deck (FCORS).
17. Reset the fuel pump. Everything picks up again.
18. Push the fuel cutout on the left side (FCOLS). Everything again drops out.
19. Reset the fuel pump. Everything picks up.
20. Move the EC switch to run. Everything will drop out.
21. EC switch to Start; push Fuel Pump Reset button, and everything will reset.
22. Remove the 1DLK2 wire. The ROR will drop out. Replace the 1DLK2 wire which resets the fuel pump.
23. Check for insulation in GS+ and GS−.
24. Push the Engine Start button (EST). GS+ and GS− will pick up.
25. Release and remove the cover on the barring over switch.
26. Push the Engine Start button (EST). GS's will not pick up.
27. Replace the barring over switch cover (BOS) and push EST. Check the GS's will pick up again.
28. Put a jumper on BCR 2A to 2C. EC switch to run. Fuel pump will continue to run.
29. Manually pick up LBR. GSDH2 will drop out. Also, a GSL yellow light on the EC panel.

B&N CABLESS

23. SEQUENCE

Condition

1. All switches and breakers open. Battery switch open.
   Results will be: AP is energized.
2. Close battery switch.
   Results will be: A+CR.
3. Close the control breaker (COB).
   Results: A+GOR+CR.
4. Close ECCB.
   Results: A+GOR+CR.
5. Close LCCB.
   Results: A+GOR+CR.
6. Close ECB.
   Results: A+EF+GOR+CR.
7. Close
   Results: A+EF+GOR+CR.
8. Close LCB.
   Results: B.
9. Jumper BCR2A to 2C. Push fuel pump reset button FPRBI.
   Results: B+NTR+EAFR+FPR+ROR.
10. NOTE: There are three stop buttons, two fuel trip buttons, and the COP that will trip FPR. When you trip and reset, the locomotive status will change from B to C. Also use FBRB2.
11. Open EAFR (temporarily insulate EAFR2A to 2C). Reset the fuel pump relay.

Results: Only EAFR drops out.
12. Temporarily remove 1DLK2 wire at TB2F-J.
   Results: ROR drops out. Reset FPRB1.
13. NOTE: Check insulation in GS+ and GS−. Push EST switch.
   Results: GS+ and GS− pick up.
14. See that the jumper is still on BCR2A to 2C. BC switch to run.
   Results: C.
15. With the test kit, pick up TL8.
   Results: C+Reverser RE+RVX.
16. Test kit will drop out TL8 and pick up TL9.
   Results: C+Reverser Forward+RVX.
17. The test kit close TL6.
   Results will be: C+GF+GFA+P1+P2+P3+P4+GOR will drop out. This is N1.
18. Test kit close TL16.
   Results are now: D+ER. This is N2.
19. Test kit close TL15.
   Results are: D+AVR+AV.
20. Test kit open TL15. Close TL7. This is N3.
21. Test kit open TL15. Close TL7. D+CVR+AV+CV.
22. Test kit close TL15. N4.
   Results: D+AVR+CVR+BV.
23. Test kit open TL15. Close TL3 and TL12. N5.
   Results: D+CVR, BVR, DVR+AV, BV, CV, DV.
24. Test kit close TL15. N6.
   Results: D+AVR+BVR+CVR+DVR+AV+BV+CV+DV.
25. Test kit open TL15 and TL3. N7.
   Results: D+BVR, CVR+BV+CV.
26. Test kit close TL15. N8.
   Results: D+AVR+BVR+CVR+AV+BV+CV.
   NOTE: Notch 8 will be result E circled.
27. Test kit open TL15, 12, 7 and close TL3. M.U. stop.
   Results: DV.
28. Reset fuel pump breaker #1, open TL3, push ESP 1, 2 or 3. Stop.
   Results: C+ROR, NTR, EPFR, FPR.
29. EC switch to winter isolate. Reset the fuel pump.
   Results: C+CD.
30. Open TL6+TL16+EC to Run+close TL17. Braking set-up.
   Results: C+BR1+BKT (B).
31. Test kit close TL24.
   Results: Variable 24+HBR.
32. All breakers closed. Battery switch closed. Test kit neutral.
   Results: CR+GOR+EF.
33. SLTS2 train line.
   Results: SOL light on SLTS2 set up.
   Results: SOL light off. BKA, ER, BR1, ECRR, GF and GFA.
34. SLTS2 DB.
   Results: Same as above+HBR+Excitation CHECK panel.
35. SLTS2 N1.
   Results: STR1+STR2+GF+Reverser.
36. SLTS2 N2.
   Results: GF+AV.
37. SLTS N3.
   Results: AV+CV.
38. SLTS N4.
   Results: BV.
39. SLTS N5.
   Results: AV, BV, CV, DV.
40. SLTS N6.
   Results: AV, BV, CV, DV.
41. SLTS N7.
   Results: BV, CV.
42. SLTS N8.
   Results: AV, BV, CV. Turn off SLTS. Return to condition E.
43. Pick up BSR.
   Results: ER drops out.
44. Reset BSR and pick up BR1.
   Results: ER drops out.
45. Reset BSR, BR1.

TABLE I

| MU | FUNCTION |
|---|---|
| 1 | SPARE |
| 2 | SIGNAL & BELL |
| 3 | ENGINE SPEED & EXCITATION |
| 4 | CONTROL NEGATIVE |
| 5 | EMERGENCY SAND |
| 6 | GEN. FIELD MOTORING |
| 7 | ENGINE SPEED & EXCITATION |
| 8 | LOCO DIRECTIONAL |
| 9 | LOCO DIRECTIONAL |
| 10 | WHEELSLIP |
| 11 | SAND TIED TO PIN 23 |
| 12 | ENGINE SPEED & EXCITATION |
| 13 | CONTROL POSITIVE |
| 14 | SPARE |
| 15 | ENGINE SPEED & EXCITATION |
| 16 | ENGINE RUN |
| 17 | DYNAMIC BRAKING SET-UP |
| 18 | SPARE |
| 19 | SPARE |
| 20 | SPARE |
| 21 | BRAKE START |
| 22 | COMPRESSOR SYNCHRONIZATION |
| 23 | SAND TIED TO PIN 11 |
| 24 | BRAKING EXCITATION |
| 25 | MU HEADLIGHT |
| 26 | SPARE |
| 27 | SPARE |

TABLE II

| DEVICE NAME | DESCRIPTION |
|---|---|
| AA2L | AXLE ALTERNATOR (FOR SPEED IND.) |
| ACCB | AIR CONDITIONER CB (2 POLE-100 AMP) |
| ACCR | ALTERNATOR CURRENT CONTROL REACTOR |
| AG | AUXILIARY GENERATOR (REBUILT) |
| AM | AIR BRAKE MANIFOLD FOR SR |
| AP | ANNUNCIATOR PANEL |
| AR | LOAD METER RESISTOR |
| ARC1,2 | HEADLIGHT SWITCH SUPPRESSION |
| ATC | ATTENDANT CALL BUTTON |
| ATS | AMBIENT TEMPERATURE SENSOR |
| ATSC | CONNECTOR FOR ATS |
| BATT | LOCOMOTIVE BATTERY |
| BCCB | BATTERY CHARGE CB (2 POLE-150 AMP) |
| BCCR | BRAKING CURRENT CONTROL REACTOR |
| BCP | BREAKING CONTROL POTENTIOMETER |
| BCPS | BRAKE CYLINDER PRESSURE SWITCH |
| BELL | ALARM & SIGNAL BELL |
| BKR-DM | BRAKING DELAY MODULE (10 SEC) |
| BKT | BRAKING SWITCH |
| BL1,2 | BRAKING GRID BLOWER MOTOR (PART OF DEG) |
| BOS | BARRING OVER SAFETY SWITCH |
| BRG | DYNAMIC BRAKING GRID |
| BS | BATTERY SWITCH |
| BSR-DM | BSR DELAY MODULE (30 SEC) |
| BSS1,2 | BRAKE BLOWER SPD SENSOR (PART OF DBG) |

TABLE II-continued

| DEVICE NAME | DESCRIPTION |
|---|---|
| BWL | BRAKE WARNING LIGHT |
| CCLS | CONTROL COMPARTMENT LIGHT SWITCH |
| CCRS | TRAIN SENTRY RESET SWITCH |
| CGS 1 | COMPRESSOR GOV. PRESSURE SWITCH |
| CGS 2 | 2 POLE: 130/140 PSI PU 135/145 DO |
| CHB1,2 | CAB HEATER CIRCUIT BRKR (2 POLE-100 AMP) |
| CHU1 | CAB HEATER #1 (ENGR'S SIDE) |
| CHU2 | CAB HEATER #2 (HELPERS SIDE) |
| CLR | BATTERY CHARGE LIMIT RESISTOR |
| CM | COMPRESSOR MAGNET VALVE |
| COB | CONTROL CIRCUIT BREAKER 1 POLE - 30A |
| COP | CRANKCASE OVERPRESSURE SWITCH |
| COPL | CRANKCASE OVERPRESSURE LIGHT |
| CWLS | CROSSWALK LIGHT SWITCH |
| DBCB | DYNAMIC BRAKE CONTROL BREAKER 1 POLE - 2A |
| DBG | BRAKING GRID PACKAGE |
| DBGTB | BSS1,2 TERMINAL BOARD |
| DBM | DYNAMIC BRAKING MAGNET VALVE |
| DBS | DYNAMIC BRAKE DISABLE SWITCH |
| DOL | DOME LIGHT |
| DOLS | DOME LIGHT SWITCH |
| DP1 | DIODE PANEL |
| DP2 | DIODE PANEL |
| EAFL | ENGINE AIR FILTER LIGHT |
| EC | ENGINE CONTROL BREAKER |
| ECB | EXCITATION CONTROL BREAKER 2 POLE - 15A |
| ECC | EDDY CURRENT CLUTCH |
| ECCB | EDDY CURRENT CLUTCH BREAKER 2 POLE - 15A |
| ECCR | EDDY CURRENT CLUTCH RES. PANEL |
| EFM | EXCITER FIELD MOV |
| EFPS | ENG. AIR FILTER PRESSURE SWITCH 14" H₂O |
| EFR | EXCITER FIELD & EXCITATION RESISTORS (EFR 1-5 & OVDR) |
| EGR-DM | EGR DELAY MODULE 10 SEC |
| EH | ENGINEMAN'S SIDE HEATER |
| EHB | ENGINEMAN'S HEATER BREAKER (2 POLE - 20A) |
| EOL | ENGINEMAN'S ORDER LIGHT |
| EOLS | ENGINEMEN'S ORDER LIGHT SWITCH |
| EOT | ENGINE OVERTEMPERATURE LIGHT |
| EOTC | END OF TRAIN CONNECTOR/CABLE |
| ERS | ENGINE RUN SWITCH (BREAKER) 1 POLE - 15A |
| ESP1 | ENGINE STOP BUTTON |
| ESP2 | ENGINE STOP BUTTON |
| EST | ENGINE START BUTTON |
| ETV | ELECTRONIC TIMER |
| EXC | EXCITER |
| EXP | CHEC EXCITATION PANEL |
| FCOLS | FUEL CUTOFF - LEFT SIDE |
| FCORS | FUEL CUTOFF - RIGHT SIDE |
| FCWL | FRONT CROSSWALK LIGHT |
| FDV1 | FILTER DRAIN VALVE - FRONT |
| FDV2 | FILTER DRAIN VALVE - REAR |
| FHB | FRONT HEADLIGHT BREAKER (1 POLE 15A) |
| FHL1,2 | FRONT HEADLIGHT |
| FHR | FRONT HEADLIGHT RESISTOR |
| FHS | FRONT HEADLIGHT SWITCH |
| FNLL1,2 | FRONT NUMBER LIGHTS - LEFT SIDE |
| FNLR1,2 | FRONT NUMBER LIGHTS - RIGHT SIDE |
| FNLS | SHORT HOOD NUMBER LIGHT SWITCH |
| FPB | FUEL PUMP CIRCUIT BREAKER 2 POLE - 15A |
| FPM | FUEL PUMP MOTOR |
| FPRB1 | FUEL PUMP RESET BUTTON |
| FPRB2 | FUEL PUMP RESET BUTTON |
| FSCV1,2 | FORWARD SAND CONTROL MAGNET VALVE SALEM 500-BS-1-20 |
| FSLL,R | FRONT STEP LIGHTS |
| FWWL | FRONT WALKWAY LIGHT |
| GFB | ALTERNATOR FIELD CIRCUIT BREAKER 1 POLE - 15A |
| GFR | ALT. FIELD SUPPRESSION RESISTOR |
| GL1-7 | GAGE LIGHTS |

TABLE II-continued

| DEVICE NAME | DESCRIPTION |
|---|---|
| GLR | GAGE LIGHT RHEOSTAT |
| GLS | GAGE LIGHT SWITCH |
| GOLRL | ALTERNATOR OVERLOAD LIGHT |
| GORB | GROUND RELAY RESET BUTTON |
| GOV | ENGINE GOVERNOR 1050 RPM |
| GOV | ENGINE GOVERNOR 1000 RPM |
| GPP | GRID PROTECTION PANEL |
| GRAR | GROUND RELAY AUTOMATIC RESET |

TABLE III

| DEVICE NAME | DESCRIPTION |
|---|---|
| GRCO | GROUND RELAY CUTOUT SWITCH |
| GRL | GROUND RELAY LIGHT |
| GSD-DM | GOVERNOR SHUTDOWN RESET DELAY (19 SEC) |
| GSL | GOVERNOR SHUTDOWN LIGHT |
| GR-DM | GROUND RELAY DELAY (30 SEC) |
| HH | HELPER'S SIDE HEATER |
| HHB | HELPER'S HEATER BREAKER 2 POLE-20A |
| HML | HOT TRACTION MOTOR LIGHT |
| HOL | HELPER'S ORDER LIGHT |
| HOLS | HELPER'S ORDER LIGHT SWITCH |
| HOTS | HOT OIL TEMPERATURE SWITCH |
| HWTS | HOT WATER TEMPERATURE SWITCH |
| IBS | INDEPENDENT BRAKE SWITCH 13/5 PSI PU - 5/7 DO |
| LA | LOAD AMMETER |
| LBTS | LOAD BOX TOGGLE SWITCH |
| LCB | LIGHTING CIRCUIT BREAKER 2 POLE - 30A |
| LCCB | LOCAL CONTROL CIRCUIT BREAKER 2 POLE - 30A |
| LCP | LOAD CONTROL POTENTIOMETER |
| LHB | LIGHT/HORN BOX |
| LOP-DM | LOW OIL PRESSURE DELAY MODULE 19 SEC. |
| LOPS | LUBE OIL PRESSURE SWITCH |
| LOT-DM | LOW OIL TEMPERATURE DELAY MODULE 10 MIN. |
| LOTS | LUBE OIL TEMPERATURE SWITCH |
| LS | LOADMETER SHUNT |
| LSS | LEAD AXLE SAND SWITCH |
| LT1-2 | POWER DEVICE COMPARTMENT LIGHTS |
| LT3-4 | CONTROL DEVICE COMPARTMENT LIGHTS |
| LWP-DM | LOW WATER PRESSURE DELAY MODULE (19 SEC) |
| MCO | MOTOR CUT OUT SWITCH |
| MC | MASTER CONTROLLER |
| MSP | MOTOR SPEED PANEL |
| MTP | MOTOR TEMPERATURE PANEL-1000 RPM |
| MUHL | MU HEADLIGHT SETUP SWITCH |
| MTP | MOTOR TEMPERATURE PANEL-1050 RPM |
| NBC | NO BATTERY CHARGE LIGHT |
| OMR-DM | OPEN MOTOR DELAY MODULE (150 SEC) |
| OMR12 | OPEN MOTOR SENSING RELAY |
| OMR23 | OPEN MOTOR SENSING RELAY |
| OMR45 | OPEN MOTOR SENSING RELAY |
| OMR56 | OPEN MOTOR SENSING RELAY |
| OSB | OVERSPEED CIRCUIT BREAKER 2 POLE-15A |
| OSV | OVERSPEED MAGNET VALVE |
| OTS1-3 | RECTIFIER OVERTEMPERATURE SWITCH |
| OTS11-13 | RECTIFIER OVERTEMPERATURE SWITCH |
| OVRB | OVERVOLTAGE RELAY RESET BUTTON |
| PCL | POWER CONTROL RELAY OPEN LIGHT |
| PCS | POWER CONTROL PRESSURE SWITCH 58/62 PSI PU - 38/42 DO |
| PL1-4 | CONSOLE PANEL LIGHTS |
| PLS | NOTCH 7 POWER LIMIT SWITCH |
| R20,20A | EXCITER FIELD DISCHARGE RESISTORS |
| R21,21A | BRAKING REF DIVIDER RESISTOR |
| R23-26 | DELAY MODULE LOAD RESISTORS |
| R28 | LOAD SIMULATION RESISTOR |
| R39 | NOTCH #1 EXCITATION RESISTOR |
| R54-65 | WARNING LIGHT RESISTORS |
| R66-71 | GAGE & PANEL LIGHT RESISTORS |
| R72 | SANDING LIGHT RESISTOR |

TABLE III-continued

| DEVICE NAME | DESCRIPTION |
|---|---|
| R73 | WHEELSLIP LIGHT RESISTOR |
| R74 | BRAKE WARNING LIGHT RESISTOR |
| R76 | PC LIGHT RESISTOR |
| R79-82 | GAGE LIGHT RESISTORS |
| RC | REVERSE CURRENT BLOCKING DIODE |
| RCB | RADIO CIRCUIT BREAKER 2 POLE - 15A |
| RCM | SPEED RECORDER CURRENT MODULE |
| RCWL | REAR CROSSWALK LIGHT |
| RE1-3, 11-13 | TRACTION RECTIFIER PANEL |
| REL-DM | REDUCED EXCITATION LIGHT DELAY 150 SECONDS |
| REV | REVERSER SWITCH |
| RHB | REAR HEADLIGHT BREAKER 1 POLE 15A |
| RHL1,2 | REAR HEADLIGHT |
| RHR | REAR HEADLIGHT RESISTOR |
| RHS | REAR HEADLIGHT SWITCH |
| ROL | RECTIFIER OVERTEMPERATURE LIGHT |
| RPP | RADIO POWER PLUG |
| RSCV1,2 | REAR SAND CONTROL MAGNET VALVES SALEM 600-BS-1-20 |
| RSLL,R | REAR STEP LIGHTS |
| RT1-3 | EGR PICKUP STEERING DIODES |
| RT10 | FPM SUPPRESSION DIODE |
| RT26 | SA T/L BLOCKING DIODE |
| RT41,42 | ES T/L BLOCKING DIODES |
| RT20 | XB T/L BLOCKING DIODE |
| RT19 | OWPR BLOCKING DIODE |
| RT24 | GR BLOCKING DIODE |

TABLE IV

| DEVICE NAME | DESCRIPTION |
|---|---|
| RT27 | GS+, - BLOCKING DIODE |
| RT21 | XB T/L BLOCKING DIODE |
| RT11 | BLOCKING DIODE |
| RT22 | BLOCKING DIODE |
| RT23 | BLOCKING DIODE |
| RT39 | AUX GEN SUPPRESSION DIODE |
| RT4 | BSR BLOCKING DIODE |
| RT43 | GOLR BLOCKING DIODE |
| RT18 | ETHR BLOCKING DIODE |
| RT60 | CM SUPPRESSION DIODE |
| RT61 | FDV1,2 SUPPRESSION DIODE |
| RT62 | WFMV SUPPRESSION DIODE |
| RT66 | ECC SUPPRESSION DIODE |
| RT5 | DV T/L SUPPRESSION DIODE |
| RT6-9 | GOV. SOLENOID SUPPRESSION DIODES |
| RT80-81 | FSCV1, RSCV1 SUPPRESSION DIODE |
| RT82,83 | FSCV2, RSCV2 SUPPRESSION DIODE |
| RT84 | OSV SUPPRESSION DIODE |
| RT85 | DBM SUPPRESSION DIODE |
| RT86 | SCMV SUPPRESSION DIODE |
| RT90 | BELL SUPPRESSION DIODE |
| RWWL | REAR WALKWAY LIGHT |
| RT32 | MCO COIL SUPPRESSION DIODE |
| SCB | SAFETY CONTROL BREAKER 2 POLE - 15A |
| SCVM | SAFETY CONTROL MAGNET VALVE |
| SD1-206 | SUPPRESSION MODULE |
| SD116 | GF SUPPRESSION MODULE |
| SI | SPEED INDICATOR |
| SL | SAND LIGHT |
| SLBL | SELF LOAD BOX LIGHT |
| SLS | STEP LIGHT SWITCH |
| SP1,2 | SUPPRESSION PANEL |
| SPP | SURGE SUPPRESSION PANEL |
| SPS | EMERGENCY SAND PRESSURE SWITCH (30 SEC) |
| SR | SPEED RECORDER |
| SS1-6 | MOTOR SPEED SENSORS |
| SSM1 | GFA SUPPRESSION MODULE |
| SSW | SANDING SWITCH |
| TA | TRACTION ALTERNATOR |
| TB1A-D | TERMINAL BOARD |
| TB2A-J | TERMINAL BOARD |
| TB3B | TERMINAL BOARD |

TABLE IV-continued

| DEVICE NAME | DESCRIPTION |
|---|---|
| TB5A-C | TERMINAL BOARD |
| TB6A,B | TERMINAL BOARD |
| TB9 | TERMINAL BOARD |
| TCL1,2 | TOILET COMPARTMENT LIGHT |
| TGORB | TRAINLINE GROUND RELAY RESET BUTTON |
| TM1-6 | TRACTION MOTOR |
| TSB | TRAIN SENTRY BOX |
| TSL | TOILET COMPARTMENT STEP LIGHT |
| TSLS | TOILET COMPARTMENT LIGHT SWITCH |
| TTS | TURBO SPEED SENSOR |
| THB | TOILET TANK HEATER BREAKER 2P - 10A |
| TTH | TOILET TANK HEATER |
| VRR | VOLTAGE REGULATOR |
| VSR2 | VOLTAGE SENSING RELAY |
| WCB | WATER COOLER CIRCUIT BRKR 2 POLE-15A |
| WCR | WATER COOLER RECEPTACLE |
| WFMV | WATER FLOW CONTROL MAGNET VALVE |
| WL | WARNING LIGHT |
| WLB | WARNING LIGHT BREAKER 2 POLE-15A |
| WSL | WHEELSLIP LIGHT |
| WTS1 | WATER TEMPERATURE SWITCH 195 F |
| WTS2 | WATER TEMPERATURE SWITCH 200 F |
| WTS3 | WATER TEMPERATURE SWITCH 180 F |

What is claimed is:

1. A portable test set for testing operability of a locomotive, the test set being adapted for external testing of internal functions of the locomotive, the locomotive including an externally accessible multi-conductor train line for transmitting and receiving command functions from other locomotives, each end of said train line terminating in a multiple unit connector and a governor connector, the test set comprising:

a portable case;

connector means attached to said case and adapted for coupling to both said multiple unit connector and said governor connector of the train line externally of the locomotive, said connector means including pins in said test set operatively coupled to each conductor of the multi-conductor train line when said connector means is coupled to the train line;

switch means in said test set attached to said case and coupled to first selected ones of said pins for providing signal excitation on selected ones of said conductors in said train line, said switch means being operable to input horsepower commands and thereby energize and operate said locomotive from a locomotive battery, said switch means being operable to energize selective functions of said locomotive from said test kit; and indicator means in said test set attached to said case and coupled to second selected ones of said pins for providing an indication of signal status on the respective conductor associated with a corresponding one of said pins, said indicator means providing data representative of locomotive operability.

2. The test set of claim 1 and including a plurality of galvanometers operatively mounted in the test set and a plurality of connection means attached to said case, each of the galvanometers having at least a pair of terminals connected to a corresponding pair of the connection means, the connection means being adapted for connection to multiple points in an on-board electronic control system in the locomotive for providing an indication of signal condition at each of the multiple points.

3. The test set of claim 2 and including at least one rheostat mounted in the test set and connected in series electrical circuit between respective ones of a pair of said connection means for variably controlling resistance loading at the points coupled to said respective ones of the connection means.

4. A method for testing operability of a diesel-electric locomotive using a portable test kit having indicator lights and switches selectively coupled to connection means in tile test kit, the method comprising the steps of:

connecting the test kit to an MU connector and a governor connector at one end of the locomotive;

sequentially energizing each pin in an MU connector at another end of the locomotive and observing such energizing at the one end of the locomotive by illumination of corresponding lights in the test kit;

actuating switches in the test kit for applying commands to selected conductors in the MU connector and observing tile action of the locomotive in response to such commands, said commands including horsepower commands for energizing and operating said locomotive from a locomotive battery; and actuating selected functions in the locomotive and observing that corresponding commands are transmitted to the MU connector resulting in illumination of respective ones of the indicator lights.

5. The method of claim 4 wherein the test kit includes a plurality of galvanometers and including the further step of:

connecting the galvanometers in circuit with select control devices in the locomotive; and actuating selected functions in the locomotive and simultaneously observing the results thereof on the plurality of galvanometers.

6. The method of claim 5 wherein the test kit includes adapters for coupling to air lines of the locomotive at one end thereof and pressure gauges and bleeder valves operatively associatable with the adapters, the method including the further steps of measuring air pressure developed by the locomotive and air flow recovery rate by observing pressure readings on the gauges while opening the bleeder valves.

* * * * *